May 5, 1970 G. BOUCHER 3,509,624

METHOD OF MAKING MULTILAYER PRINTED CIRCUITS

Original Filed Dec. 2, 1965 2 Sheets-Sheet 1

INVENTOR
GERALD BOUCHER
BY [signature]
ATTORNEY

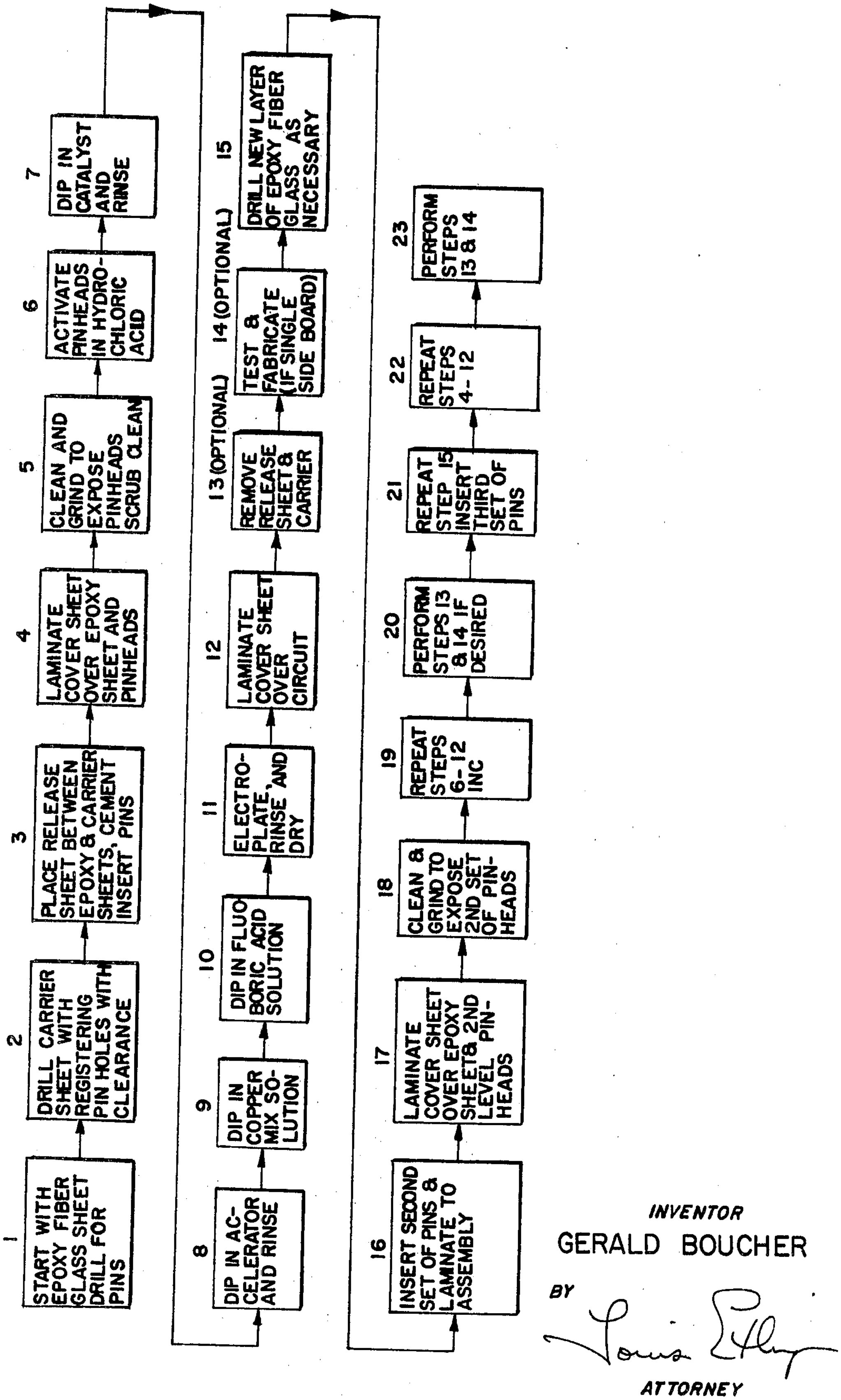
*INVENTOR*
GERALD BOUCHER
*BY* [signature]
*ATTORNEY*

United States Patent Office 3,509,624
Patented May 5, 1970

3,509,624
METHOD OF MAKING MULTILAYER PRINTED CIRCUITS

Gerald Boucher, Hudson, N.H., assignor to Sanders Associates, Inc., Nashua, N.H., a corporation of Delaware Original application Dec. 2, 1965, Ser. No. 415,378. Divided and this application Sept. 11, 1967, Ser. No. 672,674
Int. Cl. H02g *15/00*
U.S. Cl. 29—624 7 Claims

ABSTRACT OF THE DISCLOSURE

A method for making a printed circuit is described in which headed metallic pins are inserted into holes in a sheet of insulating material with the bottom of the heads engaging the surfaces and the shanks protruding. Additional insulating material is laminated to the surface over the heads of the pins and then enough is removed to expose the heads to make them flush with the surface. Next, a metallic film is deposited on the entire surface, after which a layer of metal is built up by electroplating. A circuit is formed by coating resist, making, exposing and etching. The finished circuit is covered with additional insulating material. Additional layers can be formed by repeating these steps.

This application is a division of my presently pending application Ser. No. 415,378 filed Dec. 2, 1964, now abandoned and entitled "Multilayer Printed Circuit Having Integral Connecting Pins, Sockets or Terminals."

This invention relates to printed circuits, and more particularly, to multilayer printed circuits and methods of producing them, and provides such circuits which include pins, sockets, and terminals as a monolithic structure containing, as an assembly, all of the necessary or desired hardware and all of the required interconnecting printed circuitry.

This invention is an improvement of the invention described and claimed in my earlier patent application entitled "Printed Circuits and Methods of Producing Same," Ser. No. 277,646, to which refeernce may be had. In the referenced application, I start with a copper sheet, or a nickel sheet plated with copper, of sufficient thickness to be self-supporting. This sheet is cleaned, coated with a light-sensitive resist, covered with a film mask and exposed. It is then developed, rinsed, and etched to form the circuitry and lands, cleaned, laminated to a backing board, preferably epoxy glass, hot and cold pressed, cleaned, electroplated, again etched, again laminated, again coated with resist, exposed through a mask, developed, and cleaned. The steps of coating with resist, masking, exposing and devoloping are repeated for each layer of the plurality of layers.

The present invention is an improvement over the board of the referenced application in that, among other features, the present invention contemplates, in the board, the provision of metallic contact pins, sockets or terminals by including them in a monolithic structure containing, as an assembly, all of the necessary hardware, insulation, and all of the interconnecting printed circuitry.

Among the objects of this invention are:

To provide a multilayer printed circuit board having improved ruggedness and reliability, and characterized by the elimination of the former problems of attachment, and to provide an improved process for manufacturing the same;

To provide such a board, and a process of manufacturing it, in which certain electrical joints, heretofore believed necessary, are eliminated;

To provide such a board and a process of manufacturing it, which has a cost advantage over heretofore known boards.

Still other objects and advantages of my invention will be apparent from the specification.

The features of novelty which I believe to be characteristic of my invention are set forth with particularity in the appended claims. My invention itself, however, both as to its fundamental principles, and as to its particular embodiments, will best be understood by reference to the specification and accompanying drawing, in which FIG. 1 is a section view of a printed circuit board after the first assembly step;

FIG. 2 is a similar view after a cover layer of epoxy glass fiber has been applied over the top sheet 10 and the heads 13*a* and 14*a* of pins 13 and 14, but before the layer 22 has been ground down to expose the heads of pins 13 and 14;

FIG. 3 is a view similar to FIGS. 1 and 2 showing the top layer in FIG. 2 ground down to expose the heads 13*a* and 14*a* of pins 13 and 14;

FIG. 4 is a section similar to FIG. 2 after the first copper plating layer has been laid down on top of sheet 10 and pin heads, to molecularly unit with the heads 13*a* and 14*a* of pins 13 and 14;

FIG. 8 is a view similar to FIG. 7 after the formation of a third level of circuitry and the application of a cover layer of epoxy fiber glass and FIG. 9 is a flow diagram of the various steps employed in manufacturing a circuit board according to this invention.

Figure 1:
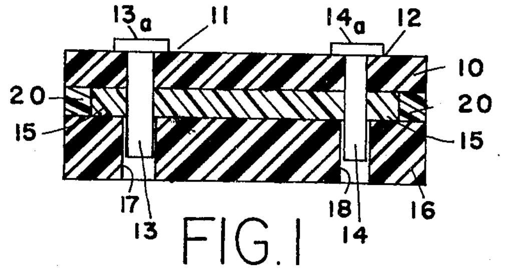

Referring now more particularly to FIG. 1, 10 designates the starting sheet of a multilayer printed circuit board according to this invention. Sheet 10 may, for example, be epoxy fiber glass, which is precision drilled at desired points with holes 11 and 12 to receive pins 13 and 14. Only two holes are shown, for simplicity, but as many may be provided as desired at various locations. The pins 13 and 14 may be of any desired metal, such as copper, nickel, beryllium copper, brass, etc., and the clearance between pins 13 and 14 and holes 11 and 12 is made relatively small, so the pins will fit tightly without wobbling in position after insertion, and will resist displacement.

Next to and below epoxy glass sheet 10 I prefer to apply a release sheet 15, such as "Teflon" or the like. The thickness of release sheet 15 is somewhat exaggerated for clarity in the drawing. Actually, sheet 10 is of the order of thickness of a sheet of paper, or even less, permitting sheet 10 to be laminated to a carrier sheet or plate 16, of any suitable material, such as fiber glass, silicon glass, or the like, by suitable cement applied between sheet 10 and carrier 16, beyond the edges of the release sheet 15. Holes 17 and 18 are provided in carrier sheet 16 for all pins to be used, but these holes are provided with sufficient clearance so that pins 13 and 14 do not fit tightly therein. It is not necessary to drill the release sheet 15 for pins 13 and 14, because when sheets 10, 15 and 16 are pressed together, pins 13 and 14 make their own holes in sheet 15.

Pins 13 and 14 are formed with heads 13*a* and 14*a* like nails, to prevent insertion of the pins too far into holes 11 and 12, and to afford a broadened surface for subsequent plating to make contact with pins 13 and 14.

Figure 2:
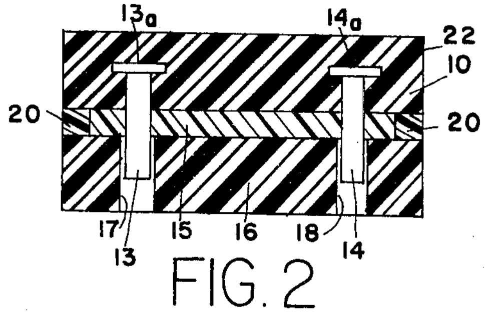
Figure 3:
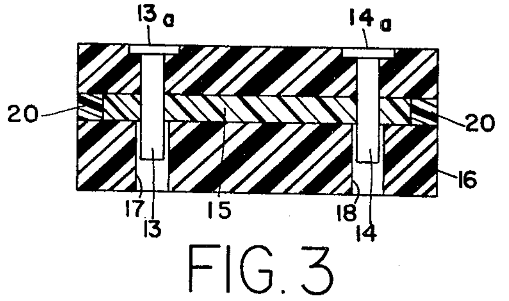
Figure 5:
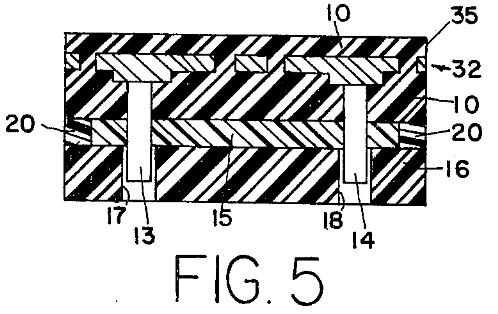
FIG. 5 is a section similar to FIG. 4 after the now top copper layer has been etched to form the first level of circuitry, and a cover layer of epoxy fiber glass has been laminated on top of the circuitry level.

After the assembly shown in FIG. 1 has been completed, a sheet 22 of suitable material such as epoxy fiber glass is laminated over the former top sheet 10 and the heads 13*a* and 14*a* of pins 13 and 14, as shown in FIG. 2. The now top sheet is ground, sanded, or otherwise thinned down to the level of the heads 13*a* and 14*a* of pins 13 and 14 to expose the heads as shown in FIG. 3. The top of the laminate is then scrubbed, and activated by dipping in hydrochloric acid, dipped in a suitable catalyst, rinsed, dipped in an accelerator, rinsed, dipped in copper mix solution, dipped in fluoboric acid, electroplated with copper to form layer 30, rinsed, and dried. Then it is coated with light-sensitive resist, dried, covered with a film mask, exposed to light (preferably ultraviolet), developed, rinsed, dried, dyed if desired, dried and touched up, and etched to form the conducting pattern 32, flushed and dried, the exposed resist removed, rinsed, dried, and if desired, dipped in "Ebanol" or the equivalent, rinse and dried. An outer sheet 35 of epoxy glass is then laminated to the assembly on top of the layer of circuitry, as shown in FIG. 5.

Figure 6:
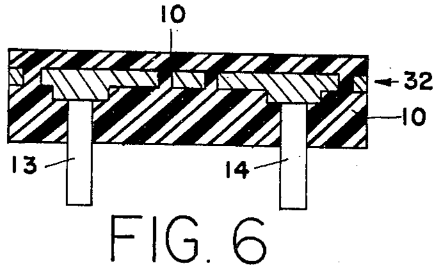
FIG. 6 is a view similar to FIG. 5, after the board is taken off the carrier, if a one-level board is desired.

This completes the board, as far as the first level of circuitry is concerned, and if a board with only one circuit layer is desired, the release sheet 15 and carrier 16 are removed and the board is ready for test and fabrication, having the appearance shown in FIG. 6.

Figure 7:
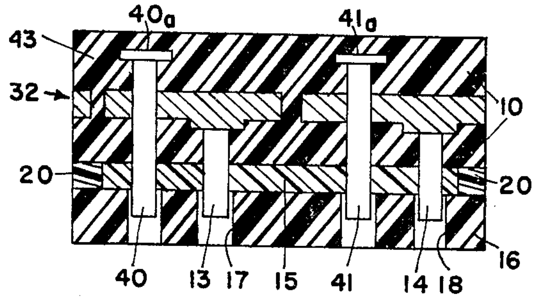
FIG. 7 is a view similar to FIG. 6, after insertion of pins connecting to the second level of circuitry, and the lamination of a layer of epoxy fiber glass over the second set of pins.

If it is desired to add a second layer of circuitry, holes will have been provided in sheets 10 and 16 for the reception of the second layer pins 40 and 41, having heads 40*a* and 41*a*, which are inserted as shown in FIG. 7, with their inner ends projecting into registering clearance holes in carrier 16, as with pins 13 and 14. Proceeding as before, a sheet of epoxy fiber glass board 43 is laminated on top of sheet 35, as shown in FIG. 7. This is cleaned or ground away, as with sheet 22, to expose the heads 40*a* and 41*a* of pins 40 and 41. The top surface is then treated as in preparing the first level circuitry, already described, i.e. scrubbed, activated, catalyzed, dipped in accelerator, rinsed, dipped in copper mix solution, dipped in fluoboric acid, electroplated to form a copper layer, coated with light-sensitive resist, exposed, developed, dyed if desired, and etched to form the second layer circuitry pattern, cleaned, and a sheet of epoxy fiber glass laminated on top of the second level circuitry, all as above described for the first level circuitry, and in the referenced application, with the same force and effect as if written out here.

This completes the board with two levels of circuitry, and if only a two-level board is desired, the release sheet 15 and carrier 16 are removed and the board is ready for test and fabrication.

Figure 8:
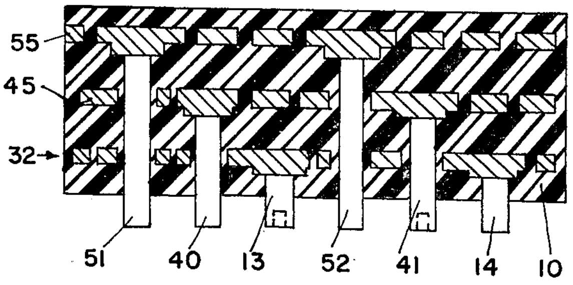
Figure 4:
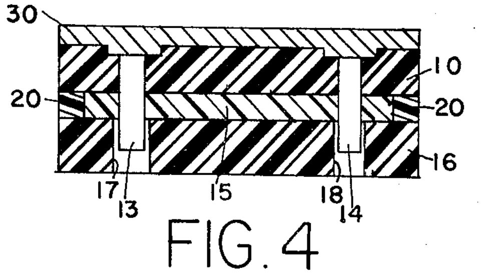

If a third level of circuitry is desired, the steps followed in building the first and second levels are repeated. At the conclusion of the formation of the third level, the board has the appearance shown in FIG. 8, with the three levels of circuitry 32, 45 and 55 separated and each covered by insulation 10. It will be noted that as each sheet of epoxy fiber glass is laminated to the assembly, the boundary lines between the sheets, which existed before lamination, disappear, and the structure becomes monolithic, with the pins 13, 14, 40, 41, 51 and 52 embedded solidly in the insulation. The term pins also includes sockets, socket holes formed in pins 13 and 14 at their lower ends, terminals, inductances, capacitors, and resistors; and the finished board has the appearance shown in FIG. 8, with all internal circuitry embedded in the plastic and covered thereby, and with only the pins protruding from one side of the board and terminating in a plane parallel to but spaced from the bottom surface of the adjacent insulation. This latter feature is important in facilitating the making of external connections to the pins, by welding or staking, or both, and thus to the circuitry within the monolithic structure of the finished board.

It should also be noted that the thicknesses of the various layers of insulation and conductor applied during manufacture of the board have been greatly exaggerated in the drawing, for clarity, and that actually the finished board is far thinner than might be thought from FIGS. 1–8.

The board so far described contains three levels of circuitry, but it will be understood that still more levels may be added, if desired, by following the procedures already described, thus producing a board having four, five or more levels of circuitry, each level having its own set of connecting pins embedded in and protruding from the finished board.

Referring now to FIG. 9, the manufacture of a circuit board according to this invention starts (step 1) with an epoxy glass fiber sheet or the equivalent, which is precision drilled with holes to receive the pins, the thickness of the sheet and the size of the holes being so related to the diameter of the pins that the latter, when inserted, are held snugly against displacement and wobble. The carrier sheet is next drilled with all pin holes, including those required for second and higher layer level pins (step 2), having sufficient clearance for the pins that the latter do not bind in the carrier sheet. Then (step 3) the release sheet is placed between the epoxy fiber glass sheet and the carrier sheet, cemented in position around the edges, and the pins fully inserted in the epoxy fiber glass sheet.

A sheet of epoxy glass fiber is then applied on the top, and laminated by suitable heat and pressure, to cover the pin heads (step 4) and the top sheet cleaned or precision ground to expose the pin heads (step 5), and scrubbed clean. The pin heads are activated in hydrochloric acid (step 6), dipped in catalyst and rinsed (step 7), dipped in accelerator and rinsed (step 8), dipped in copper mix solution (step 9), dipped in fluoboric acid solution (step 10), electroplated to the desired conductor thickness, rinsed and dried (step 11), and a cover sheet of epoxy glass fiber or the equivalent laminated to the assembly by heat and pressure (step 12).

If only a single level circuit board is desired, the board is then separated from the release sheet and carrier (step 13), tested and fabricated by the addition of whatever components are desired (step 14). If not, another sheet of epoxy fiber glass is drilled for the pins to be used to connect to the second, third, and higher levels of circuitry (step 15), the second level pins inserted (step 16), and the second level epoxy fiber glass sheet placed in position, and laminated to the assembly (step 17). This cover sheet is applied, laminated to the assembly, and then cleaned and/or precision ground to expose the second level pin heads (step 18). Steps 6–12 inclusive are then repeated (step 19). Steps 13 and 14 are then performed, if a two-level board is desired. Steps 4–12 are then repeated with a cover sheet of epoxy fiber glass drilled for the third level pins, and if a three-level board is desired, steps 13 and 14 are performed.

Additional levels of circuitry up to the number desired are made, by adding another layer of epoxy fiber glass at the top, carrying its pins, to the assembly, laminating it, cleaning or grinding to expose the pin heads, electroplating and etching the next level of circuitry, and laminating another top sheet in position, in the manner described.

The following trade names and sources of material preferably employed are:

"White Dot" scrubbing compound, Etchomatic, Inc., Waltham, Mass.

"Kodak" Photo Resist, "Kodak" Photo Resist Dye, and "Kodak" Photo Resist Developer, Eastman Kodak Company, Rochester, N.Y.

"Stripper 77," catalyst 6F, and electroless copper mix solution 328, Shipley Company, Wellesley, Mass.

"Ebanol," Enthone Corporation, New Haven, Conn.

112V–E730 "B" staged epoxy glass, U.S. Polymeric Chemical, Inc., St. Paul, Minn.

Fluoboric acid (reagent grade), T. J. Baker Chemical, Phillipsburg, Pa.

Cupric fluorborate, Allied Chemical, N.Y.

The terms used herein have the meanings stated in my earlier application, to which reference has been made.

In the foregoing, I have described certain preferred forms of my invention, and the best mode presently contemplated by me for carrying it out, but it will be understood that modifications and changes may be made without departing from the spirit and scope thereof.

I claim:

1. The process of manufacturing a printed circuit comprising the steps of
- forming holes in a sheet of insulating material constituting a substrate,
- inserting headed metallic pins into said holes with the heads engaging the surface of said substrate, said pins having shanks of a diameter to fit snugly in said holes and a length sufficient to protrude significantly beyond the substrate,
- covering said substrate with additional like insulating material with a thickness at least sufficient to be flush with the tops of the heads of said pins,
- depositing a metallic film over the entire surface of said additional material,
- electroplating a layer of conductive material onto the heads of said pins and over the surface of said metallic film to form a continuous, homogeneous body of metal, molecularly uniting said pins with the electro plated layer, and
- removing a portion of said electroplated layer to form a circuit.

2. The process of manufacturing a printed circuit board as claimed in claim 1 in which the step of covering said substrate includes the steps of laminating insulating material over both the substrate and the heads of the pins and thinning down the laminated material to the level of the heads of the pins to expose them.

3. The process of manufacturing a printed circuit board as claimed in claim 1 in which the step of removing a portion of the electroplated layer includes selectively etching the layer to form the circuit.

4. The process of manufacturing a printed circuit board as claimed in claim 1 further comprising the steps of
- forming holes in a carrier plate, in the same pattern as the holes in the substrate, but larger than the shanks of said pins,
- cementing the carrier plate to the substrate near the edges of each prior to inserting the pins therein so that when inserted, the shanks of the pins project into the holes in the carrier plate to be protected thereby during manufacture, and
- removing said carrier plate after all of the other steps of the process have been completed.

5. The process of manufacturing a printed circuit as claimed in claim 1 comprising the further step of covering said circuit with further insulating material similar to that of said substrate.

6. The process of manufacturing a printed circuit as claimed in claim 5 including the additional steps of
- inserting additional pins through said insulating materal, and
- forming an additional circuit connected to said additional pins.

7. The process of manufacturing a printed circuit as claimed in claim 6 including the additional step of
- covering said additional circuit with additional insulating material similar to that of said substrate.

References Cited

UNITED STATES PATENTS

| | | | |
|---|---|---|---|
| 3,322,880 | 5/1967 | Bedell et al. | 174—68.5 |
| 3,264,402 | 8/1966 | Shaheen et al. | 29—628 XR |

FOREIGN PATENTS

| | | |
|---|---|---|
| 267,172 | 3/1927 | Great Britain. |

CHARLIE T. MOON, Primary Examiner

R. W. CHURCH, Assistant Examiner

U.S. Cl. X.R.

29—625, 627, 629, 423, 529, 573, 588, 577; 117—212; 174—52, 68.5; 204—115; 317—101; 339—17, 18, 19